United States Patent
Baney

(10) Patent No.: US 7,372,115 B2
(45) Date of Patent: May 13, 2008

(54) THERMALLY ISOLATED MEMBRANE STRUCTURE

(75) Inventor: William J. Baney, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 114 days.

(21) Appl. No.: 11/274,977

(22) Filed: Nov. 16, 2005

(65) Prior Publication Data

US 2007/0108542 A1  May 17, 2007

(51) Int. Cl.
*H01L 29/84* (2006.01)

(52) U.S. Cl. ............ 257/419; 257/414; 257/415; 257/418

(58) Field of Classification Search ............ 257/40, 257/414, 53, 419, 619
See application file for complete search history.

(56) References Cited

U.S. PATENT DOCUMENTS

| | | | | |
|---|---|---|---|---|
| 5,867,302 A | * | 2/1999 | Fleming | 359/291 |
| 6,573,734 B2 | * | 6/2003 | He et al. | 324/696 |
| 6,800,912 B2 | * | 10/2004 | Ozgur | 257/414 |
| 6,942,750 B2 | * | 9/2005 | Chou et al. | 156/272.2 |
| 7,075,161 B2 | * | 7/2006 | Barth | 257/414 |
| 2002/0195673 A1 | * | 12/2002 | Chou et al. | 257/414 |
| 2005/0101047 A1 | * | 5/2005 | Freeman et al. | 438/48 |
| 2005/0146247 A1 | * | 7/2005 | Fisher et al. | 310/334 |
| 2005/0206048 A1 | * | 9/2005 | Ryu et al. | 264/614 |

* cited by examiner

*Primary Examiner*—Zandra V. Smith
*Assistant Examiner*—Telly D Green
(74) *Attorney, Agent, or Firm*—Jimmy L. Funke

(57) ABSTRACT

An MEMS device including a semiconductor substrate having an upper and lower surface, and a support structure disposed at least partially in the semiconductor substrate. The support structure includes a plurality of support members oriented to define a plurality of cells in the semiconductor substrate. A thermally isolated membrane is disposed above the upper surface of the semiconductor substrate and is supported by the support structure. At least one functional component is mounted to the membrane. The plurality of cells are located substantially beneath the at least one functional component.

20 Claims, 5 Drawing Sheets

THERMALLY ISOLATED MEMBRANE STRUCTURE

BACKGROUND

The present invention relates to microelectromechanical systems devices having a thermally isolated membrane.

Microelectromechanical systems devices, or MEMS devices, generally include a combination of electrical and mechanical components. MEMS devices are often designed to function as sensors, actuators, conductors, or the like located in various application areas including the computer industry, automotive industry, and biomedical industry. The MEMS device may be employed to sense, measure, and control different characteristics or properties of the application in which the device is being used.

A MEMS device for thermal applications typically includes a semiconductor substrate and a membrane or diaphragm mounted on the semiconductor substrate. The membrane acts as a support structure for functional components (electrical, mechanical, thermal, etc.), which are disposed on the membrane. The membrane is formed from insulating materials that are designed to minimize thermal transfer from the functional components to the semiconductor substrate. The functional components are commonly encased in a protective film to prevent damage to the functional components during use of the device. A cavity may be formed in the semiconductor substrate beneath the portion of the membrane that supports the functional components. This cavity further prevents thermal transfer from the functional components.

However, because that portion of the membrane extending over the cavity is not mechanically supported, the membrane may be mechanically weak and susceptible to breakage during processing, packaging, or during use of the MEMS device in the various application areas.

SUMMARY

The present invention relates to a support structure for the membrane of a microelectromechanical systems (MEMS) device. In one embodiment, the MEMS device includes a semiconductor substrate having an upper and lower surface, and a support structure disposed at least partially in the semiconductor substrate. The support structure includes a plurality of support members oriented to define a plurality of cells in the semiconductor substrate. A thermally isolated membrane is disposed above the upper surface of the semiconductor substrate and is supported by the support structure. At least one functional component is disposed on the membrane. The plurality of cells are located substantially beneath the at least one functional component.

In another aspect, the invention provides a method of making a microelectromechanical device. The method includes the steps of providing a semiconductor substrate having an upper surface and a lower surface, forming a thermally isolated layer on both the upper and lower surfaces of the semiconductor substrate, forming a plurality of support members in the upper thermally isolated layer and the semiconductor substrate to define a plurality of cells in the semiconductor substrate, supporting a thermally isolated membrane on the plurality of support members, and securing at least one functional component to the membrane at a position above the plurality of cells. Varied levels of thermal isolation of the membrane and functional components may be required.

In yet another aspect, the invention provides a method of making a microelectromechanical device including the steps of providing a semiconductor substrate having an upper surface and a lower surface, forming a thermally isolated layer on both the upper and lower surfaces of the semiconductor substrate, forming a plurality of support members in the semiconductor substrate to define a plurality of cells, supporting a thermally isolated membrane on the support members, securing at least one functional component to the membrane, and forming a cavity in the semiconductor substrate and the lower thermally isolated layer substantially beneath the plurality of cells.

BRIEF DESCRIPTION OF THE DRAWINGS

The above-mentioned and other features and objects of this invention, and the manner of attaining them, will become more apparent and the invention itself will be better understood by reference to the following description of embodiments of the invention taken in conjunction with the accompanying drawings, wherein.

Figure 1:
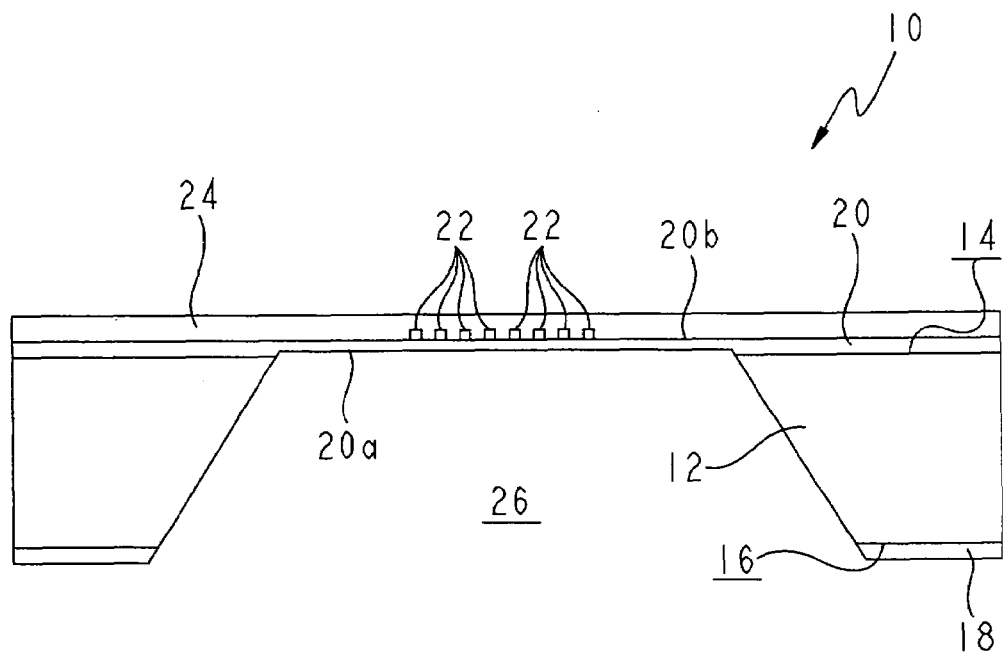
FIG. 1 is a sectional view of a MEMS device of the prior art.

Corresponding reference characters indicate corresponding parts throughout the several views. Although the exemplification set out herein illustrates embodiments of the invention, in several forms, the embodiments disclosed below are not intended to be exhaustive or to be construed as limiting the scope of the invention to the precise forms disclosed.

DETAILED DESCRIPTION

The embodiments hereinafter disclosed are not intended to be exhaustive or limit the invention to the precise forms disclosed in the following description. Rather the embodiments are chosen and described so that others skilled in the art may utilize its teachings.

Referring first to FIG. 1, microelectromechanical systems, or MEMS, device 10 of the prior art is illustrated. MEMS device 10 includes semiconductor substrate 12 having upper surface 14 and lower surface 16. Semiconductor substrate 12 is typically formed from a semi-conductive material such as silicon, or the like. Layers 18 and 20 include one or more layers formed of thermally insulating materials, such as silicon dioxide or silicon nitride. Layers 18 and 20 may be formed by oxidizing surfaces 14 and 16 of semiconductor substrate 12. Membrane 20 is mounted on upper surface 14 of semiconductor substrate and is commonly formed from a thermally insulating material, such as silicon dioxide. Membrane 20 includes lower surface 20a and upper surface 20b. Membrane 20 supports at least one functional component 22 on upper surface 20b. Protective layer 24 is formed over components 22 and upper surface 20b. Protective layer 24 is made from a non-conductive material having low thermal conductance.

Cavity 26 is etched into the underside of MEMS device 10 to remove portions of insulating layer 18 and semiconductor substrate 12. Cavity 26 is disposed directly beneath lower surface 28 of membrane 20 to allow for increased thermal isolation of functional components 22 mounted on membrane 20. With cavity 26 formed beneath membrane 20, membrane 20 is supported only at its edges and is not structurally supported beneath the portion upon which functional components 22 are mounted. This configuration lends weakness to membrane 20 and makes membrane 20 susceptible to damage during manufacturing and use of MEMS device 10.

Figure 2:
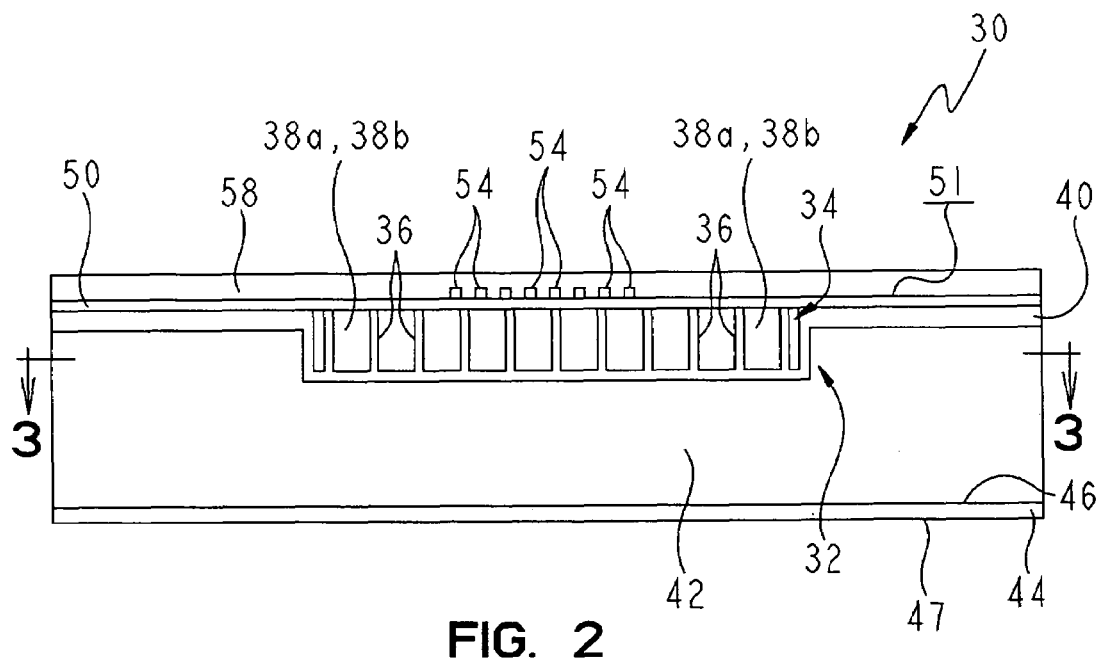
FIG. 2 is a sectional view of a MEMS device in accordance with a first embodiment of the present invention.

Referring now to FIG. 2, MEMS device 30 according to one embodiment of the present invention is illustrated. MEMS device 30 generally includes semiconductor substrate layer 42, top layer 40, lower base layer 44, support structure 32, membrane 50 supported on top layer 40 and support structure 32, functional components 54 mounted on membrane 50, and protective layer 58 overlying membrane 50 and components 54.

Layers 40 and 44 may be formed of a thermally insulating material such as an oxide or a nitride. Semiconductor substrate 42 is typically silicon, although any material which can meet the requirements of the process discussed below could be used.

Figure 3:
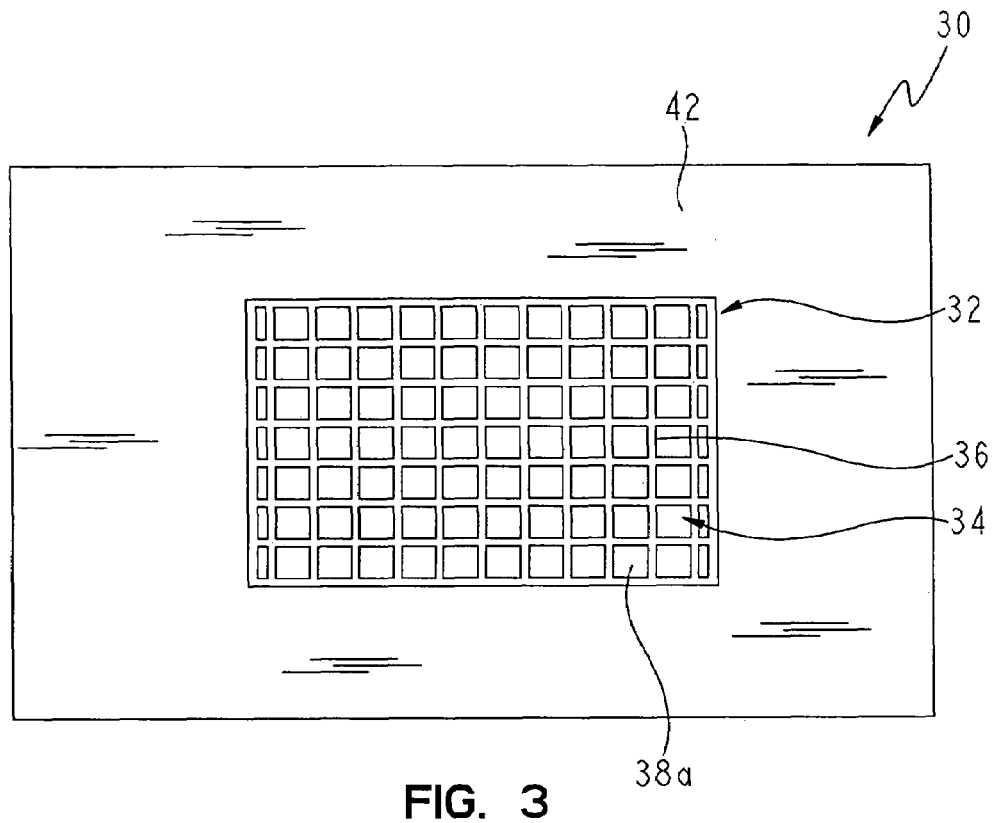
FIG. 3 is a sectional view of the MEMS device of FIG. 2 taken along lines 3-3 and illustrating a membrane support structure according to one embodiment of the present invention.
Figure 4:
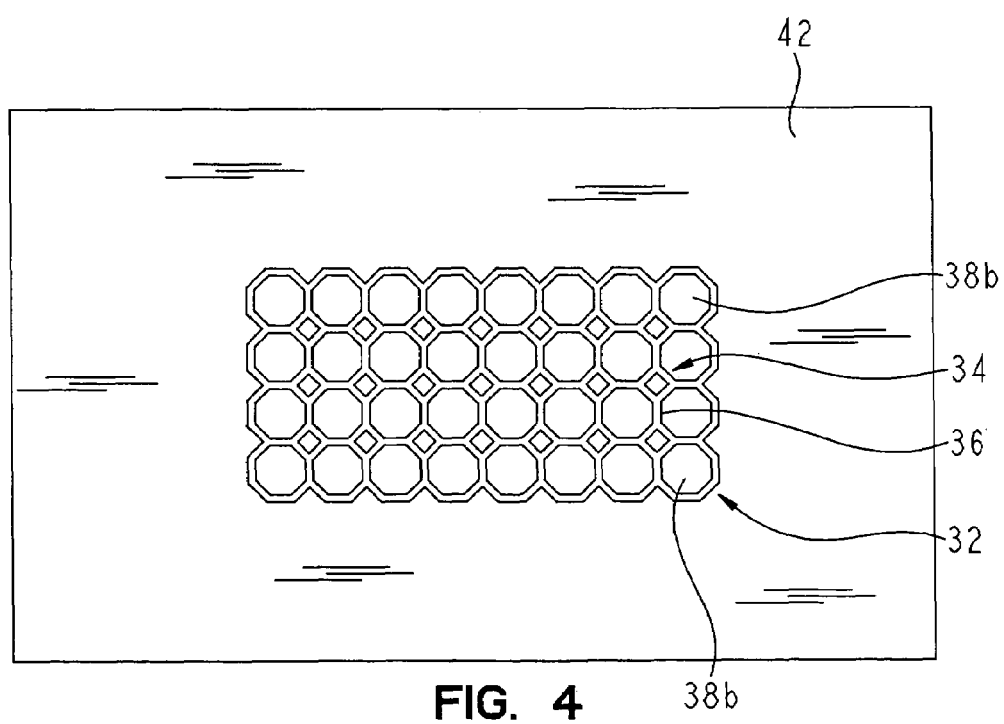
FIG. 4 is a sectional view of the MEMS device of FIG. 2 taken along lines 3-3 and illustrating a membrane support structure according to another embodiment of the present invention.

Membrane support structure 32 is provided to add strength and stability to membrane 50. Support structure 32 generally includes grid 34 and support layer 48. Grid 34 is defined by a plurality of support members 36 (FIGS. 2, 3 and 4) that cooperate to form a plurality of cells 38a, 38b. Cells 38a, 38b define a cell space. Support members 36 may be configured to form cells 38a, 38b of any shape. For instance, as shown in FIG. 3, support members 36 may be configured to form rectangular cells 38a resulting in a rectangular grid. Alternatively, support members 36 may be configured to form octagonal cells 38b, as shown in FIG. 4, thereby resulting in a honeycomb-like shaped grid. Of course, support members 36 may be configured to form any shape, including pentagonal and hexagonal. Support members 36 are formed of an etched portion of semiconductor substrate 42, as described in further detail below. After formation, the support members 36 are completely oxidized to transform from thermally conductive silicon into thermally insulating silicon dioxide. During this step, the oxide thickness over the rest of the substrate will grow as well, increasing its insulating properties.

Membrane 50 is supported on support structure 32 and is formed of any suitable insulating material, typically silicon dioxide, but may include other insulators such as silicon nitride. Functional components 54 are disposed on membrane 50. Protective layer 58 extends over membrane 50 and components 54 and is formed of a nonconductive material such as an oxide or nitride.

Figure 5:
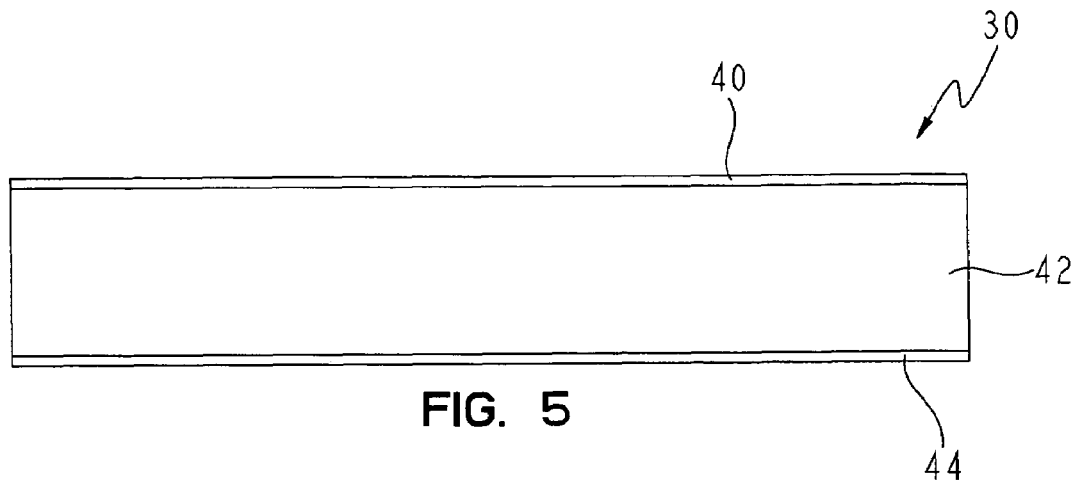
FIG. 5 is a sectional view of a MEMS device after the first processing step of a method according to one embodiment of the present invention.

Referring to FIGS. 2, and 5-10, the structure and assembly of one embodiment of MEMS 30 will now be described. Semiconductor substrate 42 is silicon. Referring to FIG. 5, layers 40 and 44 are thermally grown silicon dioxides. The thickness of this oxide may vary and is one factor in determining the thermal isolation of the functional components in the final MEMS structure. In this particular embodiment, the thickness may be between 2-3 microns. Other thermally insulating dielectrics, which are amenable to silicon direct bonding and capable of withstanding high temperature processes are applicable as well.

Figure 6:
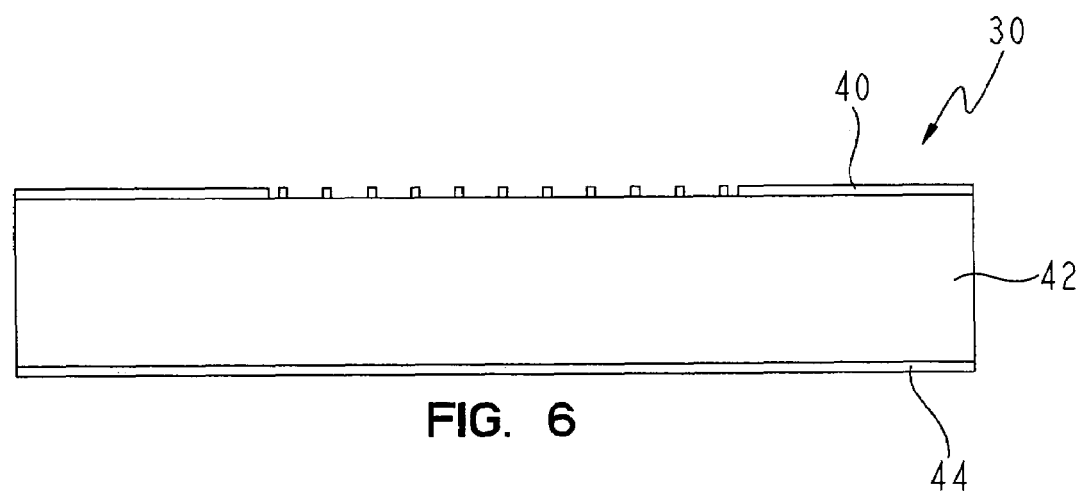
FIG. 6 is a sectional view of a MEMS device of FIG. 5 after the second processing step of the method.
Figure 7:
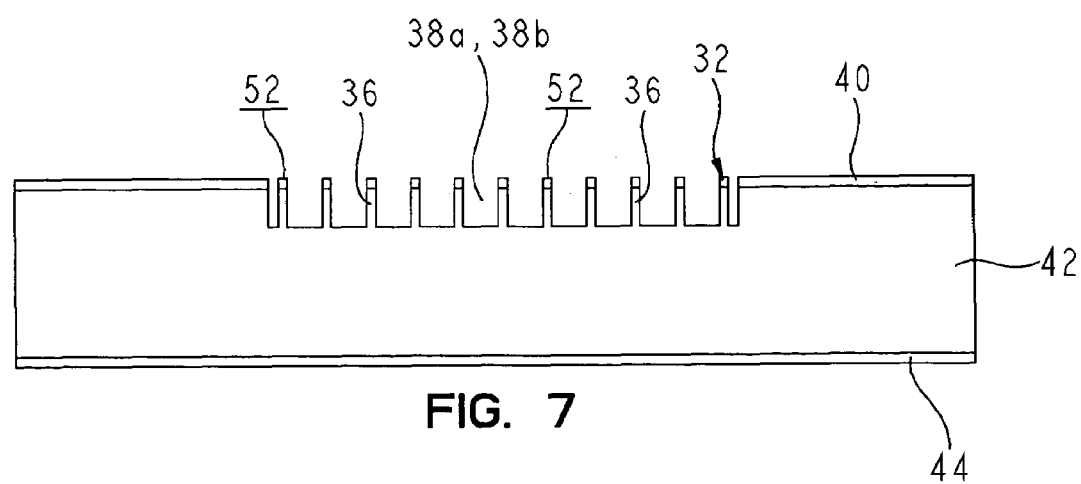
FIG. 7 is a sectional view of a MEMS device of FIG. 5 after the third processing step of the method.

Referring now to FIG. 6, grid 34 is formed first through top layer 40 by removing a portion of top layer 40 using any suitable method, such as photolithography and etching of the silicon dioxide. As shown in FIG. 7, grid 34 is then further formed in silicon substrate 42, thereby removing a portion of silicon substrate 42 and forming supporting members 36, which define grid cells 38a and 38b. Supporting members 36 are typically formed using deep reactive ion etching (DRIE) to remove the silicon substrate exposed in FIG. 6. The width of supporting members 36 will depend on subsequent thermal oxidation steps, as the silicon forming the supporting members 36 are entirely converted to silicon dioxide during these oxidations. In this embodiment, the width of the supporting members may range from about 1.7 microns to 2.5 microns. The depth of the DRIE that creates the supporting members will also factor into the thermal isolation value of the MEMS device. The range of depths is only limited by the DRIE etcher capability. In this embodiment, the DRIE depth is 25-30 microns. As discussed above, grid 34 may be formed in any desired shape such as the rectangular grid illustrated in FIG. 3 or the honeycomb-like shaped grid illustrated in FIG. 4.

Figure 8:
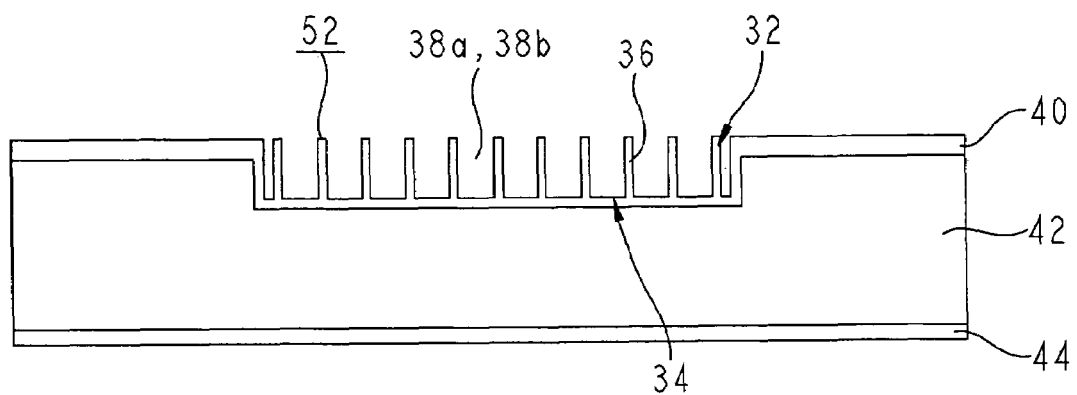
FIG. 8 is a sectional view of a MEMS device of FIG. 5 after the fourth processing step of the method.

As illustrated in FIG. 8, once grid 34 is formed in both top layer 40 and semiconductor substrate 42, an additional thermal oxidation step is performed. The purpose of this step is to oxidize the supporting members 36, modifying the structure from thermally conductive silicon to thermally insulating silicon dioxide. This oxidation step will additionally increase the thickness of top oxide layer 40, increasing its' thermal insulating value.

Figure 9:
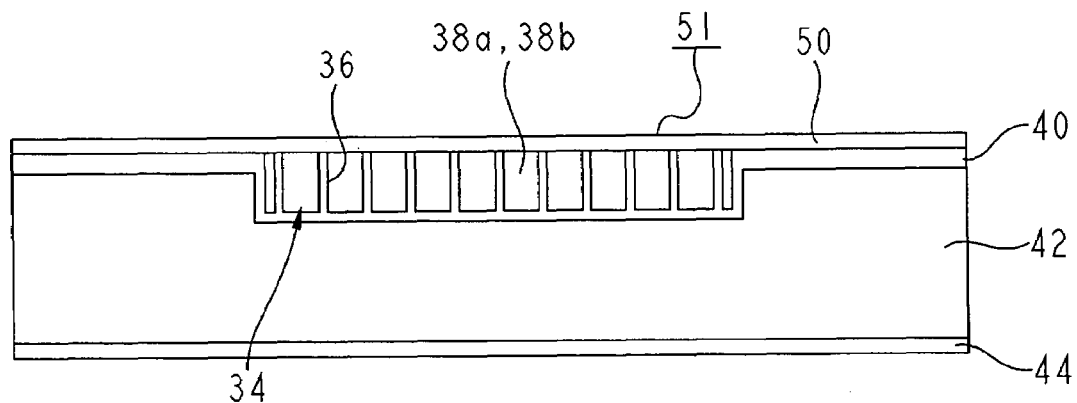
FIG. 9 is a sectional view of a MEMS device of FIG. 5 after the fifth processing step of the method.

Turning now to FIG. 9, membrane 50 is disposed on and sealed to the upper surface of top oxide layer 40 and the upper surfaces of support members 36. In this embodiment, membrane 50 may be disposed to the top surfaces by silicon direct bonding (SDB). Using this method, a second silicon substrate is placed in contact with the upper surfaces of top oxide layer 40 and support members 36, and is then heated to create a strong silicon-to-silicon dioxide bond interface. This process is optimally performed in a vacuum to increase the thermal resistance in the gaps between support members 36. After the wafers are paired in this manner, the second silicon wafer is thinned by any suitable method known in the art, such as chemical etchback (BESOI) or chemical-mechanical polishing (CMP). At this point, membrane 50 is composed of the silicon remaining from the second silicon substrate after the thinning procedure. Membrane 50 should be thin enough to allow subsequent thermal oxidation steps to completely transform the thermally conductive silicon to thermally insulating silicon dioxide. In one embodiment, silicon membrane 50 is initially about 1.3 microns thick. After thermal oxidation, membrane 50 will be about 3 microns thick. However, any thickness of silicon that can be fully oxidized may be used for membrane 50.

Figure 10:
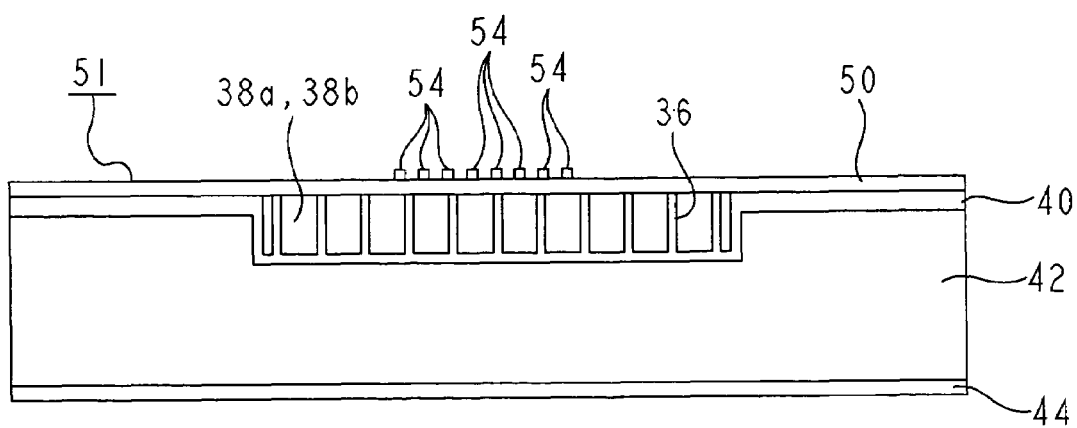
FIG. 10 is a sectional view of a MEMS device of FIG. 5 after the sixth processing step of the method.
Figure 11:
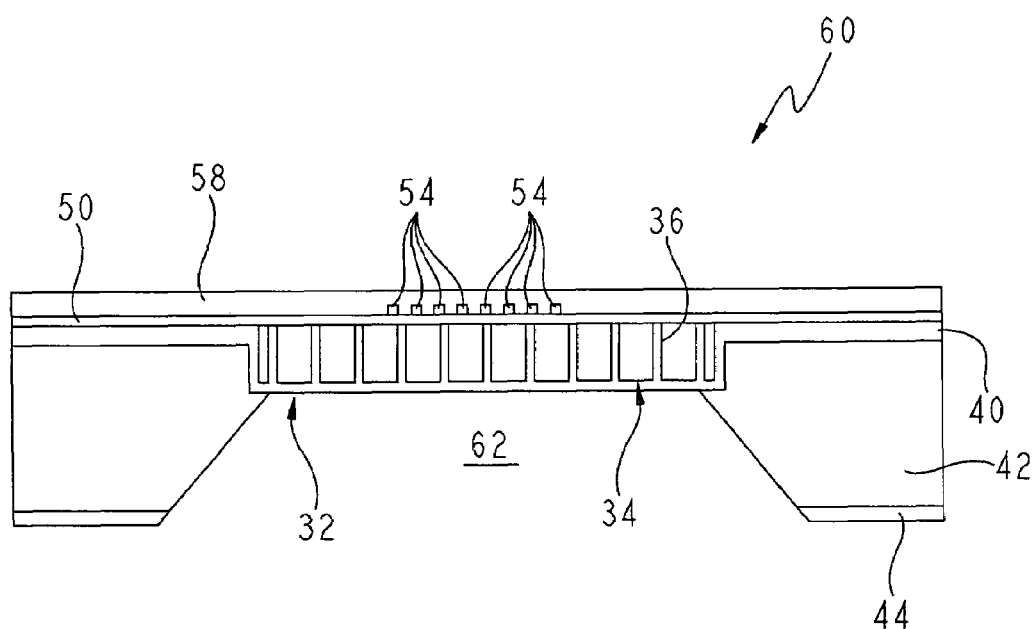
FIG. 11 is a sectional view of a MEMS device in accordance with another embodiment of the present invention.

Referring to FIGS. 10 and 11, after the oxidation step, functional components 54 are disposed on upper surface 51 of membrane 50. Protective layer 58 may be deposited onto membrane 50 to protect and thermally insulate functional components 54 (FIG. 10). Protective layer 58 may be composed of any insulating material (e.g. silicon dioxide, silicon nitride or polyimide) applicable by any of the methods known in the art (e.g. chemical vapor deposition, spin-on). The thickness of protective layer 58 may be in the range of 1-3 microns.

In an alternative embodiment illustrated in FIG. 11, cavity 62 may be formed through base oxide layer 44 and silicon substrate 42 beneath the underside of support network 32. Cavity 62 allows for further thermal isolation of membrane 50 and functional components 54. Cavity 62 may be formed by either wet or dry etching.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. A microelectromechanical device, comprising:
    a semiconductor substrate having an upper and lower surface;
    a membrane support structure disposed at least partially in said semiconductor substrate, said support structure including a plurality of support members, said plurality of support members oriented to define a plurality of cells in said semiconductor substrate, each of said plurality of cells defining a cell space;
    a thermally isolated membrane disposed above said upper surface of said semiconductor substrate and supported by contact with said support members; and
    at least one functional component mounted to said membrane, said plurality of cells located substantially beneath said at least one functional component.

2. The microelectromechanical device of claim 1 wherein said support members comprise oxidized portions of said semiconductor substrate.

3. The microelectromechanical device of claim 1 wherein said cell space is evacuated.

4. The microelectromechanical device of claim 1 further comprising a protective layer overlying said functional components and said membrane.

5. The microelectromechanical device of claim 1 wherein said cells are rectangular in shape.

6. The microelectromechanical device of claim 1 wherein said cells are octagonal in shape.

7. The microelectromechanical device of claim 1 further comprising a cavity formed in said semiconductor substrate beneath said support structure.

8. A method of making a microelectromechanical device, comprising the steps of:
    providing a semiconductor substrate having an upper surface and a lower surface;
    forming a thermally isolated layer on both the upper and lower surfaces of the semiconductor substrate;
    forming a plurality of support members in the upper thermally isolated layer and the semiconductor substrate, the support members defining a plurality of cells in the semiconductor substrate, each of the cells defining a cell space;
    supporting a thermally isolated membrane on the plurality of support members, wherein the support members are in contact with the thermally isolated membrane; and
    securing at least one functional component to the membrane at a position above the plurality of cells.

9. The method of claim 8 further comprising forming a protective layer on the membrane, the protective layer coating the at least one functional component.

10. The method of claim 8 wherein the step of forming a plurality of support members includes etching through the semiconductor substrate and the upper thermally isolated layer.

11. The method of claim 8 further including the step of forming a cavity extending into the semiconductor substrate from said lower surface, said cavity disposed beneath the plurality of cells.

12. The method of claim 8 wherein the step of forming a plurality of support members further comprises oxidizing said support members and said plurality of cells.

13. The method of claim 8 wherein said cells are rectangular in shape.

14. The method of claim 8 wherein said cells are octagonal in shape.

15. A method of making a microelectromechanical device, comprising the steps of:
    providing a semiconductor substrate having an upper surface and a lower surface;
    forming a plurality of support members in the semiconductor substrate defining a grid, said support members cooperating to form a plurality of cells in the semiconductor substrate, each of the plurality of cells defining a cell space;
    supporting a thermally isolated membrane on the grid defined by the support members of the of the semiconductor substrate;
    securing at least one functional component to the membrane.

16. The method of claim 15 further comprising forming a protective layer on the membrane, the protective layer overlying the functional components.

17. The method of claim 15 wherein the step of forming a plurality of cells includes etching into the semiconductor substrate to form the plurality of cells in the semiconductor substrate.

18. The method of claim 15, further comprising the step of forming a cavity in the semiconductor substrate and the lower thermally isolated layer, the cavity located substantially beneath the plurality of cells.

19. The method of claim 15, wherein the thermally isolated membrane is disposed on said semiconductor substrate and said plurality of support members and sealed by silicon direct bonding.

20. The method of claim 15, wherein the step of forming a plurality of support members further comprises oxidizing said support members.

* * * * *